United States Patent [19]
Amitai

[11] Patent Number: 4,797,850
[45] Date of Patent: Jan. 10, 1989

[54] DYNAMIC RANDOM ACCESS MEMORY CONTROLLER WITH MULTIPLE INDEPENDENT CONTROL CHANNELS

[75] Inventor: Zwie Amitai, Sunnyvale, Calif.

[73] Assignee: Advanced Micro Devices, Inc., Sunnyvale, Calif.

[21] Appl. No.: 862,081

[22] Filed: May 12, 1986

[51] Int. Cl.⁴ .......................... G06F 9/00; G11C 19/00
[52] U.S. Cl. ....................................... 364/900; 365/222
[58] Field of Search ... 364/200 MS File, 900 MS File; 365/222

[56] References Cited

U.S. PATENT DOCUMENTS

| | | | |
|---|---|---|---|
| 4,542,454 | 9/1985 | Brcich et al. | 364/200 |
| 4,639,890 | 1/1987 | Heiluril et al. | 364/900 |
| 4,649,511 | 3/1987 | Gdula | 365/222 |
| 4,654,804 | 3/1987 | Thaden et al. | 364/200 |
| 4,663,735 | 5/1987 | Novak et al. | 364/900 |
| 4,665,495 | 5/1987 | Thaden | 364/900 |

Primary Examiner—Felix D. Gruber
Assistant Examiner—John G. Mills
Attorney, Agent, or Firm—Nathan N. Kallman; Alan H. MacPherson; Paul J. Winters

[57] ABSTRACT

In a data processing system, a DRAM controller which is incorporated on a single semiconductor chip employs multiple column address strobe input signals that drive multiple column address strobe output signals respectively. The multiple signal channels for the column address strobe input signal and the column address strobe output signals are independent of each other and are each connected to a plurality of memory banks, but to different byte sections of the memory. Direct access to an individual byte of word-wide data is made possible.

9 Claims, 4 Drawing Sheets

Dynamic Random Access Memory Controller With Multiple Independent Control Channels

BACKGROUND OF THE INVENTION

1. Field of the Invention

This invention relates to an apparatus and a method of operation of a dynamic random access memory (DRAM) controller useful in data processing systems, and in particular to a DRAM controller employing multiple independent control channels for processing address strobe signals.

2. Description of the Prior Art

Presently known data processing systems generally include dynamic memory arrays having storage elements arranged in rows and columns. During operation, access to selected storage elements of the memory arrays or banks is achieved by means of row address and column address signals received from a computer interface and which are applied to a DRAM controller for processing. Row address strobe (RAS) and column address strobe (CAS) signals provided by the interface act to drive a timing generator or clock that controls the timing of the output of signals to the memory arrays.

When DRAMs are used in a data processing system, special circuitry is required in the address/control path to control the DRAMs and the interface to the central processing unit (CPU). This circuitry generates refresh addresses, multiplexes row, column and refresh addresses, and drives the control signals to the dynamic RAMs. In addition, it initiates the refresh cycles at the rate that is required to maintain data in the dynamic RAMs and arbitrates between refresh and access cycles. Furthermore, the sequences of addresses and control signals that are generated by the circuitry needs to satisfy the protocol and timing requirements of the DRAMs.

In some types of prior art RAM controllers such as depicted in FIG. 1, each CAS output signal is paired with a row address strobe (RAS) output signal, so that in each access cycle, one RAS and the corresponding CAS output signals are activated. Therefore, each CAS output is connected to a different memory bank, and each memory is accessed as a single indivisible unit. Such controllers are able to access directly data words of single width only, i.e., data words of one or more data bytes, but cannot access directly an individual byte of 8 bits in a data word of 16 bits or 32 bits. The access of an individual byte in a multiple byte data word is necessary in any microcomputer system that has instructions which result in a byte-write operation, that is, writing a byte of data into one of the multiple bytes of a memory word. In order to avoid the writing of irrelevant data into the remaining bytes of the memory word, only the byte that is written to may be accessed while the other bytes are not. Currently available 16 bit and 32 bit microprocessors have byte-write instructions, and microprocessor systems thus require byte-write capability and individual byte access.

Other available prior art DRAM controllers produce a single column address strobe (CAS) output signal that is connected to a multiplicity of memory banks, as illustrated in FIG. 2 of the drawings. Therefore, only one indivisible word can be accessed directly for each memory bank. If there is a need to access part of data words, external logic circuitry is required to split the CAS output from the controller and to create separate CAS signals for the separate bytes of the data word. In addition, external driver circuitry is needed to drive the CAS lines. The external logic and external driver circuits add to the chip count of the system and lengthens the propagation delay of CAS signals, on the order of 40 nanoseconds or more, which tends to degrade system performance.

In those systems in which error detection and correction are implemented, separate controls are generally required for the data memory and the check bits. Thus, more than one CAS or more than one write enable (WE) signal is needed to provide independent control of the data and separate independent control of the check bits.

SUMMARY OF THE INVENTION

An object of this invention is to provide a dynamic controller having multiple independent CAS outputs that can directly address high storage capacity DRAMs.

Another object of this invention is to provide a high performance data processing system having relatively short propagation delays and simplified logic.

Another object is to provide a data processing system including a DRAM controller that incorporates logic circuitry and drive circuitry on the same chip to accomplish address and control.

A further object is to provide a data processing system including a random access memory controller that affords access to an individual byte of a multiple-byte data word.

In accordance with this invention, an apparatus and a method of operating a DRAM controller which is used in a data processing system incorporates multiple input CAS signals that directly drive independent multiple CAS output signals respectively on a single semiconductor chip. The multiple independent signal channels, through which the CAS input and the CAS output signals are directed, are used to drive different selected signals, such as write enable or error correction data bits and check bits. The CAS signals also can access individual bytes, any combination of bytes, and portions of data words to separate sections of memory banks during the same word processing cycle without any external logic. The multiple CAS outputs of the controller preclude the need for external logic and signal drive circuitry, simplifies the system logic and significantly redudes propagation delay.

BRIEF DESCRIPTION OF THE DRAWINGS

The invention will be described in greater detail with reference to the drawing in which.

Similar numerals refer to similar elements throughout the drawing.

DETAILED DESCRIPTION

Figure 1:
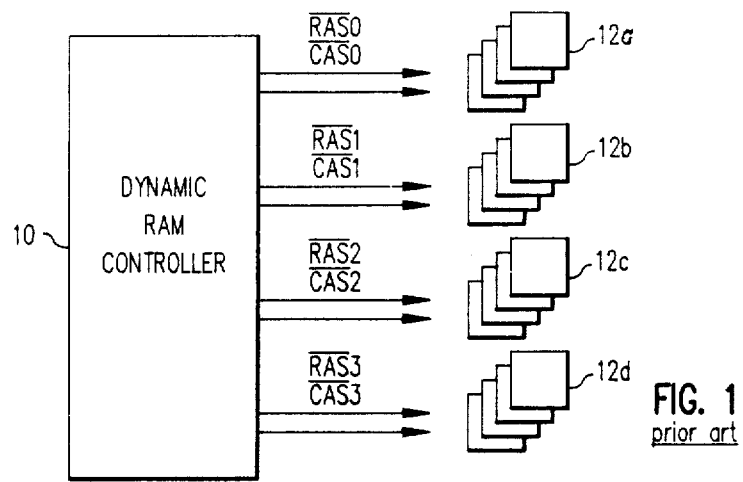
FIGS. 1 and 2 are schematic block diagrams representing the signal output flow of typical prior art DRAM controller apparatus.
Figure 2:
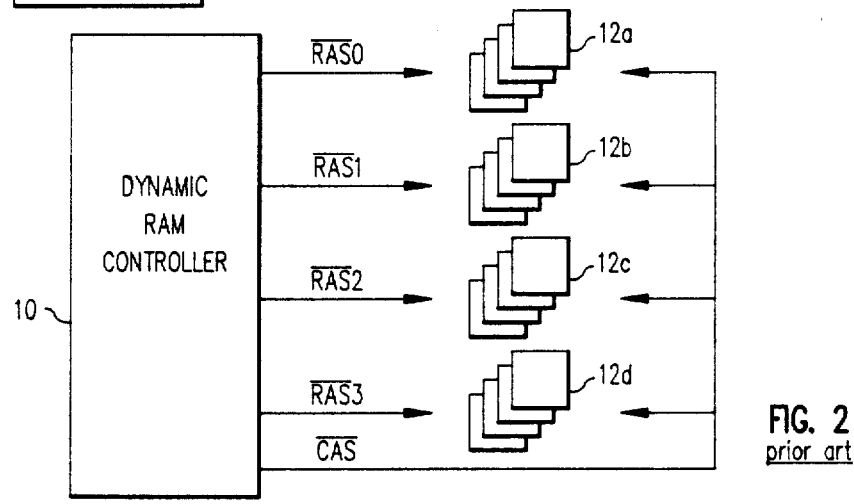
Figure 3:
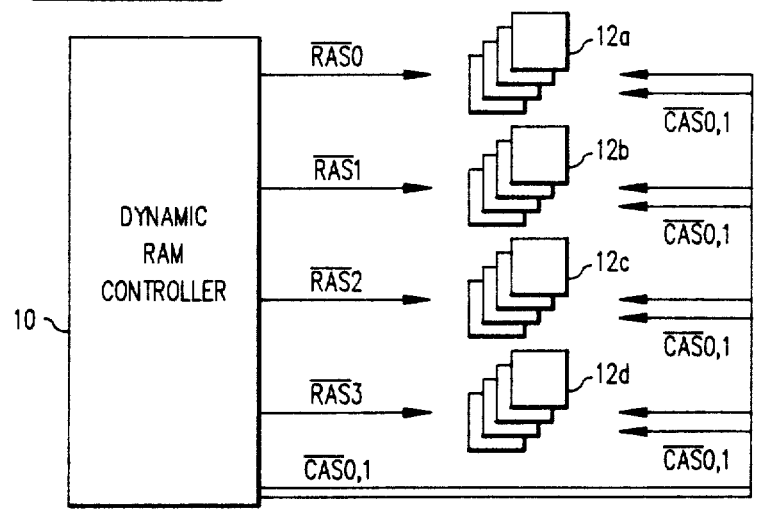
FIG. 3 is a schematic block diagram representing the signal output flow of the DRAM controller apparatus of this invention.

A representation of the novel method and apparatus incorporating the invention is set forth in FIG. 3 which includes a DRAM controller 10 that provides a plurality of row address signals RAS0 ... RAS3 respectively to an array of memory banks 12A ... 12D. The controller also provides multiple column address signals, in this implementation being two CAS output signals CAS0 and CAS1, to each one of the memory banks 12A-12D. The two CAS output signals can be selectively connected to a different 8-bit section or byte of the memory bank. In this way, each byte can be accessed individually.

Figure 4:
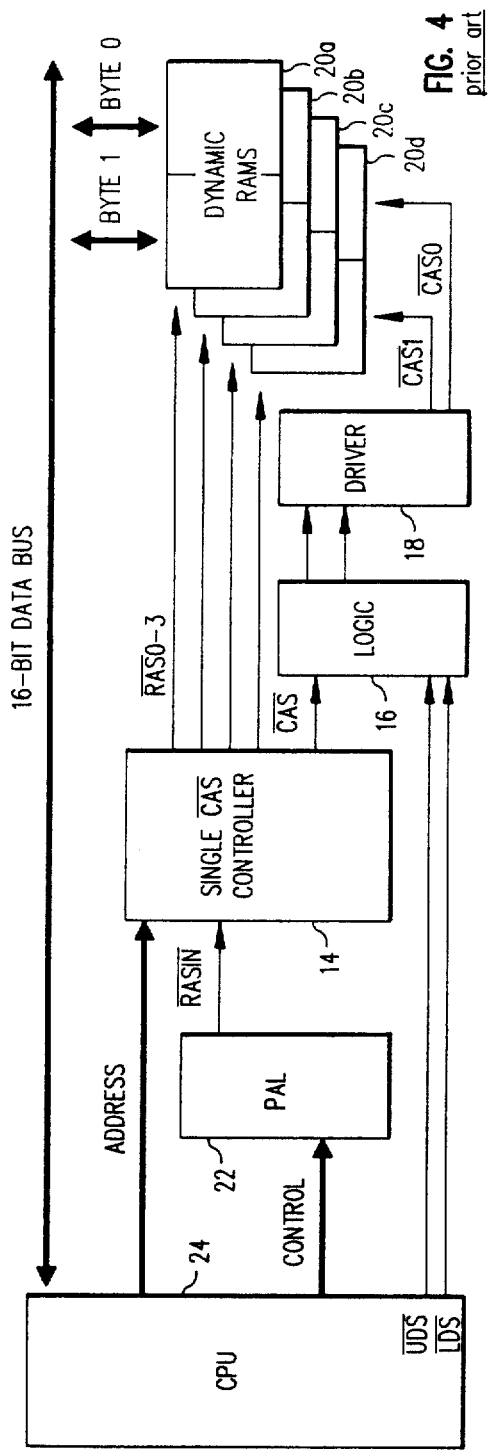
FIG. 4 is a block diagram illustrating a prior art data processing system that employs a single CAS controller.

A prior art data processing system is shown in FIG. 4, wherein a single CAS output signal is produced by a controller 14. Multiple CAS output signals are generated by means of a logic circuit 16 and driver circuit 18 that are coupled to the controller output circuits, and are directed to access the DRAMs 20A-D which in this arrangement constitutes four memory arrays. The controller 14 receives an RAS input signal from a programmable address logic circuit 22, that is controlled by a central processing unit (CPU) 24. The CPU feeds address signals through a interface to the controller which provides a plurality of RAS outputs RAS0-RAS3. Each RAS output is allocated to a respective RAM 20. The CPU also applies an upper data strobe (UDS) signal and a lower data strobe (LDS) signal to the logic circuit 16 for determining which byte will be accessed by the CAS0 and CAS1 signals. It is apparent that the use of the logic circuit 16 and driver circuit 18, which are needed to split the single CAS output in order to provide two CAS output lines to the memory, will add to the CAS propagation delay, as well as adding circuitry that requires a plurality of semiconductor chips.

Figure 5:
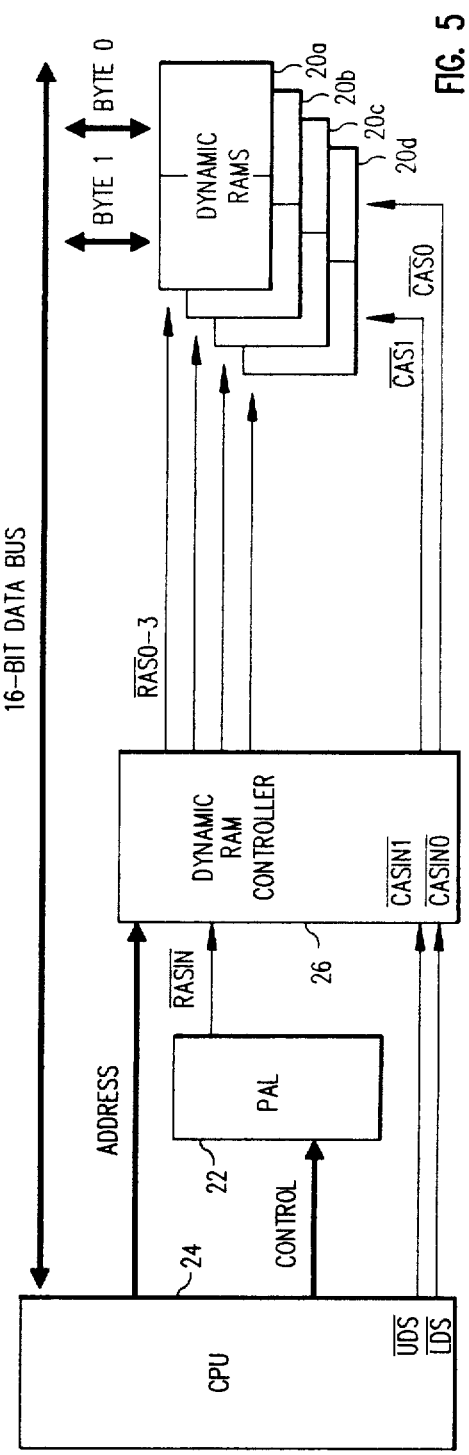
FIG. 5 is a block diagram illustrating a data processing system that incorporates the novel controller of FIG. 4.

As illustrated in FIG. 5, a data processing system made in the accordance with this invention includes a CPU 24, memory arrays 20A-24D and a DRAM controller apparatus coupled between the CPU and the memory arrays. The logic and driver circuits which are used with the prior art single CAS controller of FIG. 4 are eliminated by enabling the DRAM controller 26 to produce multiple independent CAS output signals in response to an equivalent multiple of CAS input signals. The CAS input signals CAS0 and CAS1 are developed from the application of upper data strobe (UDS) and lower data strobe (LDS) signals from the CPU 24 to the controller 26 to qualify the CAS output signals CAS 0 and CAS 1. UDS and LDS are standard acronyms for the two control signals that determine which byte in a 16-bit system is to be accessed. The CAS input signals act to control the CAS outputs directly once the columns of the memory arrays are enabled on the address outputs.

Figures 6, 7:
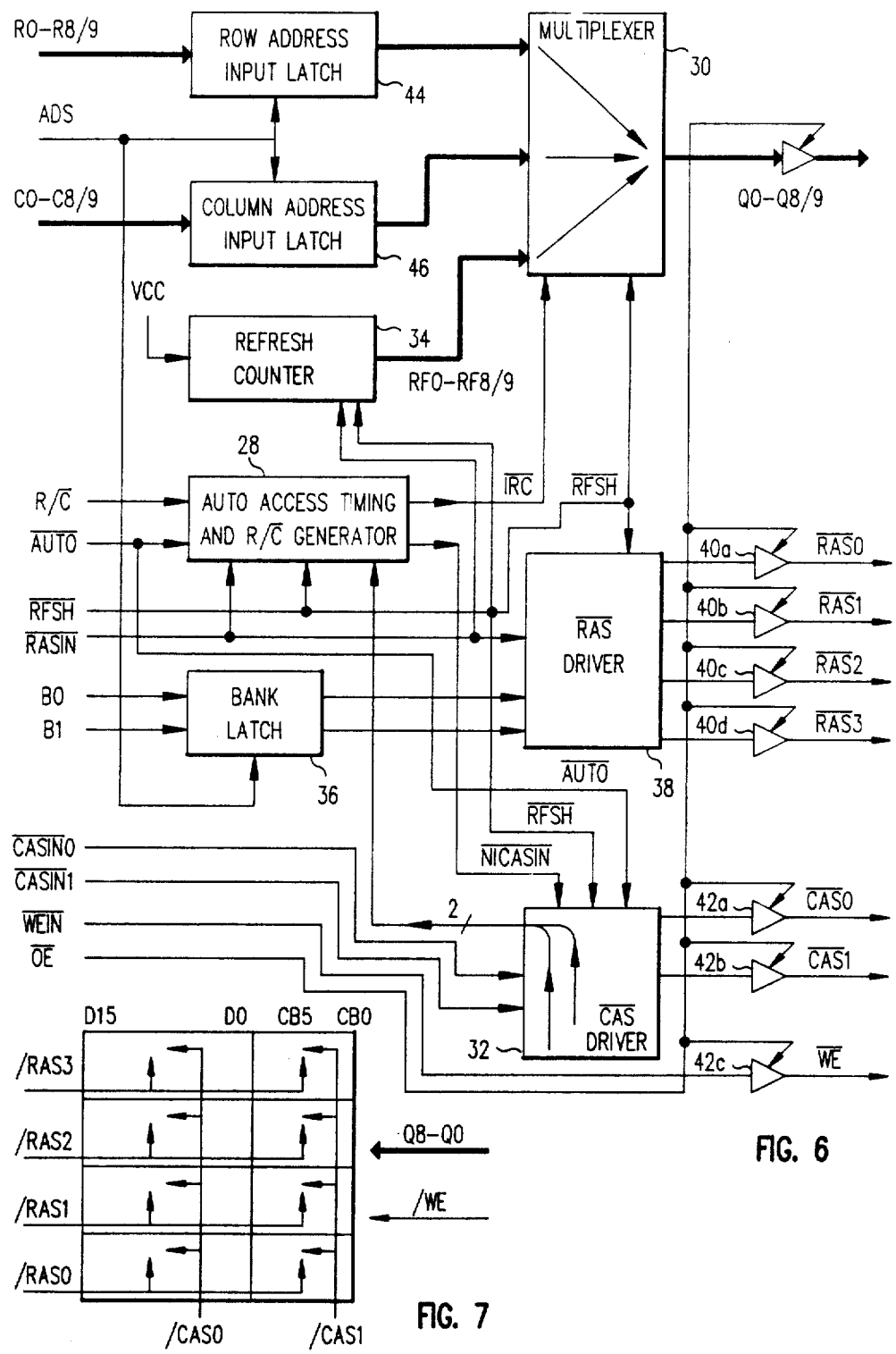
FIG. 6 is a functional block diagram of a preferred implementation of the DRAM controller, made in accordance with this invention.
FIG. 7 is a representational diagram showing the addressing of four memory banks of 22 bit words, each word consisting of 16 data and 6 correcting bits, as utilized for error correction, in accordance with this invention.

In an implementation of the data processing system of this invention, incorporating the controller apparatus of FIG. 6, three operating modes are provided, namely, Refresh, Automatic Accessing, and Externally Controlled Address.

The controller 26 provides refresh timing and generates refresh addresses during the refresh mode. The controller also arbitrates between the refresh and access modes, and multiplexes row, column and refresh addresses as well as generating control signals.

To accomplish these functions, the controller 26 includes an automatic access timing generator to provide specified timing signals to a multiplexer 30 and to a CAS signal driver 32. The timing generator 28 receives from the computer interface signals that determine the modes of operation of the system. The input signals to the timing generator 28 are the automatic (AUTO) access, the Refresh (RFSH) signal, and the ROW/COLUMN SELECT INPUT (R/C) signal. In operation of the controller, the CPU interface provides row address inputs R0-R9 which are fed to a row address input latch 44, and column address inputs C0-C9 which are applied to a column address input latch 45. The latches 44 and 46 are strobed by an address latch strobe (ADS) to pass to address input signals in parallel across busses to a multiplexer 30.

When the Refresh mode is selected, a Refresh counter 34 receives a Refresh signals RFSH from the CPU interface. The Refresh counter is a 9-bit counter that resets to zero on power-up and rolls over to zero at a given count. The RFSH signal is also applied to a timing generator 28, a CAS driver circuit 32, a RAS driver circuit 38 and a multiplexer 30. When the RFSH signal is low, the system is in the Refresh mode and the Refresh counter 34 address is enabled to provide Q0-Q9 address outputs after multiplexing by the multiplexer 30 of all the Refresh counter contents. In the Refresh mode, all of the four RAS outputs, RAS0-RAS3 are enabled to follow the RAS input (RASIN) signal, so that the row address indicated by the Refresh counter is refreshed in all of the memory banks when the RAS input is low. The Refresh counter increments the Refresh address on a transition of the RAS input signal from low to high. The CAS input and Refresh counter input signals are disabled in this mode and the CAS outputs are pulled high.

The Automatic Access Mode is selected when the AUTO input is low and the RFSH input is high. In this mode, the row/column select input (R/C) is disabled, and the RASIN input signal is fed to the RAS driver 38 to initiate the sequence of control signals for accessing the dynamic RAMs. The CAS0 and CAS1 inputs are applied to the CAS driver 32 to enable the respective CAS0 and CAS1 outputs. When the CAS input is low, a respective CAS output is enabled to be driven low and acts to access a selected byte of a memory bank. The CAS output goes high when the respective CAS input signal goes high, and the address switches back to row address only when both the CAS input signals CASIN 0 and CASIN 1 go high. In this way, there is no need for an externally derived CAS input signal to control the CAS output signal when performing a simple access to memory. The AUTO access mode provides on-chip delays that automatically control the timing delays between RAS output signals, CAS output signals and address multiplexing.

In the Externally Controlled Access Mode, all control signal outputs are controlled directly by the corresponding control input signal. When the AUTO and RFSH input signals are high, the R/C input signal directly controls the multiplexer 30. The RAS output selected by bank select inputs B0 and B1 follows th RAS input, and both the CAS0 and CAS1 outputs follow their respective CASIN0 and CASIN1 inputs. The B0 and B1 bank select inputs are supplied to a bank latch 36 which is strobed by an address latch strobe input signal (ADS). The output from the bank latch 36 is directed to the driver 38 which provides the RAS output address signals via drivers 40a-40d select a pair of the memory banks or one bank of two individually accessed bytes. The two CAS0 and CAS1 outputs from the CAS driver 32 are directed through drivers 42a-42c to enable the selection of one memory bank of the pair to be accessed or one byte of the two bytes selected by the RAS output. The write enable (WE) output signals derived from a write enable input (WEIN) from the computer interface enables the selected memory bank to perform read, write, or read-modify-write cycles. The WE signal determines which one of these memory access cycles a memory will perform. If the WE output is high and the CAS output is low, a read cycle occurs. If the WE output goes low before CAS goes low, a write cycle is initiated and data is written into the selected memory bank as CAS goes low. In the read-modify-write cycle, if the WE output goes low after a given time following CAS output going low, a read function occurs first and output data from the memory becomes valid and then data is written into the same address in the memory when the WE signal goes low. The externally controlled access mode allows the system to have direct control of the RAS outputs, the CAS outputs and row/column multiplexing.

FIG. 7 is illustrative of a data processing system incorporating error correction that utilizes the novel dynamic controller of this invention, wherein 4 memory banks of 22 bit words are addressed, each word having 16 data bits D0-D15 and 6 check bits CB0-CB5. Row address output signals RAS0-RAS3 and independent column address signals CAS0 and CAS1 are produced by the controller apparatus and applied to a selected portion of the memory banks. Multiplexed address outputs Q0-Q8 which are selected from the row address input latch 44 and the column address input latch 46 are passed from the multiplexer 30 to memory, together with a write enable WE signal.

The dynamic RAM controller of this invention can drive eight banks of DRAMs. RAS control signals are used to select a pair of banks, and the two CAS outputs enable the selection of one bank of the pair. The address lines and WE signal are connected to all eight memory banks. In a 16 bit wide memory array, for example, the RAS signals select the banks while the CAS signals select the bytes.

The timing of the various operations of the controller is defined by a clock or timing generator 28, which receives from the computer interface the row/column select input (R/C), the automatic access signal (AUTO), and two internal CAS signals from the CAS driver 32. The timing generator provides an internally generated row/column select timing signal to the multiplexer 30 and an internally generated CAS input timing signal to the CAS driver 32.

The data processing system incorporating the dynamic RAM controller disclosed herein affords simplified byte addressing logic utilizing a single semiconductor chip without the complex logic and driver circuits needed in prior known systems. The novel system can support 16K, 64K and 256K byte DRAMs with minimal propagation delays, on the order of 20 nanoseconds for example, and can directly access $2 \times 10^6$ words stored in DRAMs.

I claim:

1. A dynamic random access memory controller for providing address and control signals to memory banks comprising:
    means for providing address and control signals, including row address, column address, row address strobe and a plurality of column address strobe signals;
    row address strobe driver means coupled to said row address strobe input signal providing means for producing a multiplicity of row address strobe output signals;
    column address strobe driver means coupled to said plurality of column address strobe input signals providing means for producing a like plurality of column address strobe output signals which are processed independently in separate channels;
    means for providing an address latch strobe signal, and a bank latch coupled to a source of a pair of bank select input signals and to said address latch strobe signal providing means for enabling one of the row address strobe output signals; and
    a multiplexer coupled to said row address, column address, and row address strobe providing means for selecting row address and column address signals to produce a multiplexed output of said row address and column address signals, whereby said controller operates to selectively access individual or combinations of bytes in a data word.

2. A dynamic random access memory controller as in claim 1, including a timing generator for controlling the timing of said multiplexer and said column address strobe driver means.

3. A dynamic random access memory controller as in claim 1, including means for supplying a refresh signal; and a refresh counter coupled to the input of said multiplexer for refreshing the row address signal provided to said memory banks.

4. A dynamic random access memory controller as in claim 1, including means for operating said controller in a refresh mode, automatic access mode, or an externally controlled access mode.

5. A dynamic random access memory controller as in claim 1, including output enable signal means for enabling said row address, column address, row address strobe and column address strobe output signals.

6. A dynamic random access memory controller as in claim 1, including write enable signal means for enabling writing data at selected portions of said memory banks.

7. A dynamic random access memory controller as in claim 1, including latch means for passing said row address and column address signals in response to an address latch strobe signal.

8. A dynamic random access memory controller as in claim 7, wherein said driver means and said multiplexer are all formed on a single semiconductor chip.

9. A data processing system comprising:
    a multiplicity of random access memories, each memory having storage elements disposed in an array of rows and columns;
    a computer interface for providing a plurality of data strobe control signals;
    means for developing a like plurality of column address strobe input signals in response to said data strobe control signals;
    a dynamic random access memory controller coupled to said interface and to said memories, including a column address strobe driver coupled to said interface for generating a like plurality of independent column address strobe output signals respectively for application to selected portions of said memories in response to said column address strobe input signals; and means for coupling said plurality of column address strobe output signals independently to selected portions of said memories.

* * * * *

UNITED STATES PATENT AND TRADEMARK OFFICE
CERTIFICATE OF CORRECTION

PATENT NO. : 4,797,850

DATED : January 10, 1989

INVENTOR(S) : Zwie Amitai

It is certified that error appears in the above-identified patent and that said Letters Patent is hereby corrected as shown below:

Title page:

ABSTRACT, line 6, "signal" should read --signals--.

Col. 2, line 49, "redudes" should read --reduces--.

Col. 3, line 68, "Address" should read --Access--.

Col. 4, line 20, "to pass to" should read --to pass the--.

Col. 4, line 67, "th" should read --the--.

Signed and Sealed this

Fourteenth Day of August, 1990

Attest:

HARRY F. MANBECK, JR.

*Attesting Officer*      *Commissioner of Patents and Trademarks*